(12) United States Patent
Kamkar et al.

(10) Patent No.: US 10,522,155 B2
(45) Date of Patent: Dec. 31, 2019

(54) PULSE CODE MODULATION (PCM) DATA-MARKING

(71) Applicant: Cirrus Logic International Semiconductor Ltd., Edinburgh (GB)

(72) Inventors: Shafagh Kamkar, Austin, TX (US); Bruce E. Duewer, Round Rock, TX (US); Dylan A. Hester, Austin, TX (US)

(73) Assignee: Cirrus Logic, Inc., Austin, TX (US)

( * ) Notice: Subject to any disclaimer, the term of this patent is extended or adjusted under 35 U.S.C. 154(b) by 13 days.

(21) Appl. No.: 15/693,900

(22) Filed: Sep. 1, 2017

(65) Prior Publication Data

US 2018/0240464 A1 Aug. 23, 2018

Related U.S. Application Data

(60) Provisional application No. 62/461,398, filed on Feb. 21, 2017.

(51) Int. Cl.
*G10L 19/00* (2013.01)
*G10L 19/005* (2013.01)
*H04L 1/00* (2006.01)
*G10L 19/16* (2013.01)
*G10L 19/22* (2013.01)
(Continued)

(52) U.S. Cl.
CPC .......... *G10L 19/005* (2013.01); *G10L 19/167* (2013.01); *G10L 19/22* (2013.01); *H04L 1/0045* (2013.01); *G11B 20/00007* (2013.01); *G11B 20/10* (2013.01)

(58) Field of Classification Search
None
See application file for complete search history.

(56) References Cited

U.S. PATENT DOCUMENTS 6,774,820 B2 * 8/2004 Craven ............ G11B 20/00992
341/200
7,113,907 B2 9/2006 Duewer
(Continued)

FOREIGN PATENT DOCUMENTS

| KR | 20150115308 A | 10/2015 |
|---|---|---|
| WO | 2002/058245 A2 | 7/2002 |
| WO | 2004/051982 A1 | 6/2004 |

OTHER PUBLICATIONS

DSD Disc Format Specification, Sony Corporation, Jan. 31, 2006.
(Continued)

*Primary Examiner* — Richard Z Zhu
(74) *Attorney, Agent, or Firm* — Norton Rose Fulbright US LLP

(57) ABSTRACT

An encoding for data in an audio data stream may be indicated in the data stream using a footer stored in low-order bits of data frames in the audio data stream. When the audio data stream may include either Pulse Code Modulation (PCM) or Direct Stream Digital (DSD) data, PCM data may be marked with a footer to indicate the encoding as PCM. The footer may be a fixed value, an alternating fixed value, a predetermined sequence of values, or a value computed based on the PCM data. Examples of computed values for the footer marker may include an error code, an error correction code (ECC), and a scrambled code.

20 Claims, 6 Drawing Sheets

(51) Int. Cl.
*G11B 20/00* (2006.01)
*G11B 20/10* (2006.01)

(56) References Cited

U.S. PATENT DOCUMENTS

| | | | |
|---|---|---|---|
| 7,167,108 B2* | 1/2007 | Chu | H04N 19/70 |
| | | | 341/51 |
| 7,343,285 B1* | 3/2008 | Reinecke | G10L 19/018 |
| | | | 700/212 |
| 10,063,673 B2* | 8/2018 | Kwon | H04N 21/2362 |
| 2003/0151535 A1 | 8/2003 | Melanson | |
| 2004/0202167 A1* | 10/2004 | Jonsson | H04L 29/06 |
| | | | 370/392 |
| 2004/0234000 A1* | 11/2004 | Page | H04J 3/00 |
| | | | 375/259 |
| 2005/0078683 A1 | 4/2005 | Page | |
| 2005/0246178 A1* | 11/2005 | Fejzo | G10L 19/0017 |
| | | | 704/500 |
| 2007/0017475 A1 | 1/2007 | Ihara et al. | |
| 2007/0174756 A1* | 7/2007 | Yoneda | G11B 20/10 |
| | | | 714/768 |
| 2010/0042740 A1 | 2/2010 | Bhattacharya | |
| 2011/0224991 A1* | 9/2011 | Fejzo | G10L 19/0017 |
| | | | 704/500 |
| 2013/0236032 A1 | 9/2013 | Wakeland et al. | |
| 2014/0052454 A1 | 2/2014 | Lien | |
| 2016/0322056 A1* | 11/2016 | Yamashita | G11B 20/00007 |
| 2018/0210673 A1* | 7/2018 | Matsumoto | G06F 3/0646 |

OTHER PUBLICATIONS

DSF File Format Specification, Sony Corporation, Nov. 11, 2005.
DoP open Standard, Method for transferring DSD Audio over PCM frames, Version 1.1, Koch et al., 2012, available from: http://dsdguide-com/dop-open-standard.

* cited by examiner

PULSE CODE MODULATION (PCM) DATA-MARKING

CROSS-REFERENCE TO RELATED PATENT APPLICATIONS

This application claims the benefit of priority of U.S. Provisional Patent Application No. 62/461,398 filed on Feb. 21, 2017 and entitled "DSD Over PCM Reversed Marker Paradigm," which is incorporated by reference herein.

FIELD OF THE DISCLOSURE

The instant disclosure relates to audio processing. More specifically, portions of this disclosure relate to encoding of audio data.

BACKGROUND

Multiple data formats may be transmitted over data lines in computer circuitry or communications systems. A receiving device or receiving user needs to know the data format of the received data to correctly decode the received data to acquire the information being transmitted. In some conventional systems, a type of communication line or circuitry line is determinative of the format of data being conveyed over that communication line or circuitry line. For example, when a Serial Advanced Technology Attachment or Serial-ATA hard drive is connected through a cable to a computer motherboard, the circuitry on the motherboard can expect that data transferred through the cable is formatted according to the specifications of the Serial-ATA interface.

In other conventional systems that have multi-purpose data lines or communications lines, extra information is transmitted along with the data and that extra information may be used to determine the encoding of received data. When the encoding is determined, the information in the data may be acquired. Digital audio data carried in a stream of ones and zeros that may be transmitted over a multi-purpose data line. For example, an audio data stream may carry multi-bit audio, such as Pulse Code Modulation (PCM) audio data, or single-bit audio, such as Direct Stream Digital (DSD) audio data. Both data formats appear as ones and zeroes on the data line, but undesirable noises may be generated by the speaker if the data is decoded according to the wrong standard. Conventionally, DSD data is marked to indicate when DSD data is transmitted over the line and PCM data is carried without any marking. One conventional manner of marking DSD data is shown in FIG. 1 for DSD over PCM (DoP). FIG. 1 is a data structure for DSD over PCM (DoP) audio data according to the prior art. A PCM data frame 100 is packed with a DSD payload 104 and a marker 102. The marker is conventionally a header attached to the DSD payload 104. An example 8-bit header is shown in FIG. 2. FIG. 2 is a data structure showing a header for marking DoP audio data according to the prior art. A marker 102 is placed in a data frame 200 before the DSD payload 104. However, this technique of using the header 102 reduces available bandwidth by adding overhead to the DSD data. In the example of FIG. 2 having an 8-bit header with a 16-bit DSD payload, the header 102 uses one-third of the bandwidth or imposes a 50% overhead penalty. This is undesirable at least because of the additional power consumed in a mobile device for transmitting this additional data.

Another conventional technique is to place marker information in a separate control line that accompanies the multi-purpose data line. The control line may include, for example, a binary indication of '1' for DSD data and a '0' for PCM data. However, this technique is also undesirable as the control line increases complexity of integrated circuit layouts.

Shortcomings mentioned here are only representative and are included simply to highlight that a need exists for improved electrical components, particularly for audio decoders and encoders employed in consumer-level devices, such as mobile phones. Embodiments described herein address certain shortcomings but not necessarily each and every one described here or known in the art. Furthermore, embodiments described herein may present other benefits than, and be used in other applications than, those of the shortcomings described above.

SUMMARY

An encoding for data in an audio data stream may be indicated in the data stream using a footer stored in low-order bits of data frames in the audio data stream. The footer may be used to indicate whether multi-bit audio data or single-bit audio data is encoded in the audio data stream. When the audio data stream may include either Pulse Code Modulation (PCM) or Direct Stream Digital (DSD) data, PCM data may be marked with a footer to indicate the encoding as PCM. Although examples involving DSD- and PCM-encoded data are provided throughout the described embodiments, the disclosure is not limited to these as formats for identification using the footer. The footer may be a fixed value, an alternating fixed value, a predetermined sequence of values, or a value computed based on the PCM data. Examples of computed values for the footer marker may include an error code, an error correction code (ECC), and a scrambled code.

Attaching a footer value to mark the PCM data, as opposed to the prior art method of attaching a header to mark the DSD data, improves utilization of the audio data stream bandwidth. When the data stream is operating at a rate fast enough to carry DSD data, there is spare bandwidth when transporting PCM data to include a footer without loss to the PCM data. The marking of PCM data allows a receiver to differentiate between DSD data transmitted over a PCM channel and PCM data transmitted over a PCM channel. Furthermore, because the DSD data has no additional overhead, more DSD data can be fit in a frame and an interface carrying the audio data stream may be operated at a lower sample rate. In the case of a 32-bit data frame, marking of the PCM data rather than marking of the DSD data, the audio data stream may operate at half the sample rate of the conventional DoP solution of marking the DSD data. For example, data carried over a DoP data stream at a 384 kHz sample rate in 24-bit frames may be carried in a data stream with footer-based PCM markers at a 192 kHz sample rate in 32-bit frames. The footer-based PCM marker audio stream thus transmits the same data at lower bandwidth.

A method for processing an audio data stream with a footer marker indicating PCM data may include analyzing a selected set of low-order bits of a plurality of frames from the audio data stream, followed by identifying the encoding of the audio data stream based on contents of the selected set. Likewise, an audio data stream may be encoded by encoding the audio signal into a plurality of data frames for the audio data stream, wherein each of the plurality of data frames comprises a footer value in low-order bits of each of the plurality of data frames indicating an encoding of the audio data stream.

Electronic devices incorporating devices for processing an audio data stream using a footer to mark multi-bit audio data from single-bit audio data described herein may benefit from improved bandwidth utilization, reduced power consumption, and higher audio quality in components of integrated circuits in the electronic devices. The integrated circuits may include an analog-to-digital converter (ADC). The ADC may be used to convert an analog signal, such as an audio signal, to a digital representation of the analog signal. Such an ADC, or a similar digital-to-analog converter (DAC), may be used in electronic devices with audio outputs, such as music players, CD players, DVD players, Blu-ray players, headphones, portable speakers, headsets, mobile phones, tablet computers, personal computers, set-top boxes, digital video recorder (DVR) boxes, home theatre receivers, infotainment systems, automobile audio systems, and the like.

The foregoing has outlined rather broadly certain features and technical advantages of embodiments of the present invention in order that the detailed description that follows may be better understood. Additional features and advantages will be described hereinafter that form the subject of the claims of the invention. It should be appreciated by those having ordinary skill in the art that the conception and specific embodiment disclosed may be readily utilized as a basis for modifying or designing other structures for carrying out the same or similar purposes. It should also be realized by those having ordinary skill in the art that such equivalent constructions do not depart from the spirit and scope of the invention as set forth in the appended claims. Additional features will be better understood from the following description when considered in connection with the accompanying figures. It is to be expressly understood, however, that each of the figures is provided for the purpose of illustration and description only and is not intended to limit the present invention.

BRIEF DESCRIPTION OF THE DRAWINGS

For a more complete understanding of the disclosed system and methods, reference is now made to the following descriptions taken in conjunction with the accompanying drawings.

DETAILED DESCRIPTION

Figure 1:
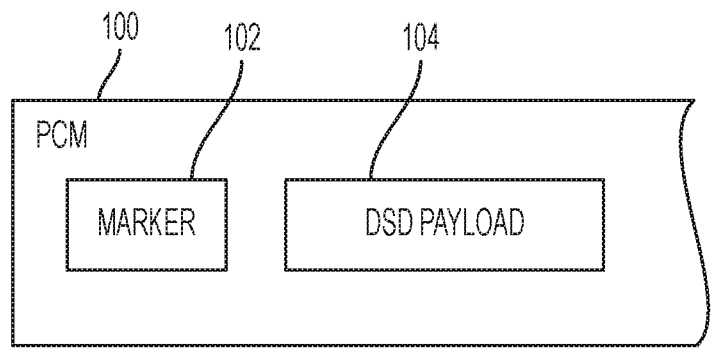
FIG. 1 is a data structure for DSD over PCM (DoP) audio data according to the prior art.
Figure 2:
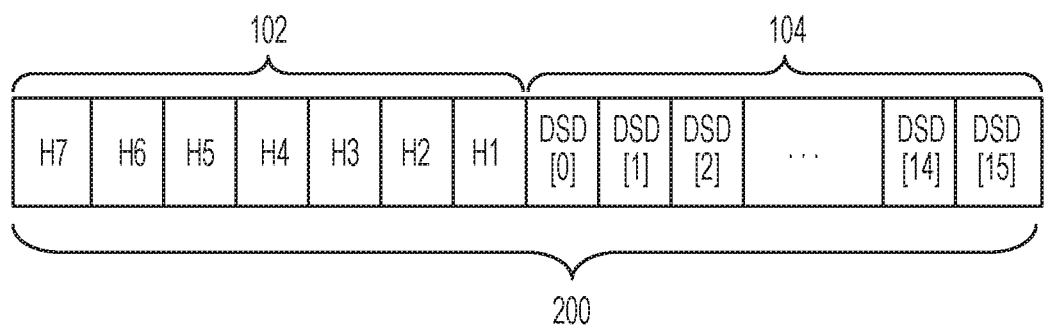
FIG. 2 is a data structure showing a header for marking DoP audio data according to the prior art.
Figure 3:
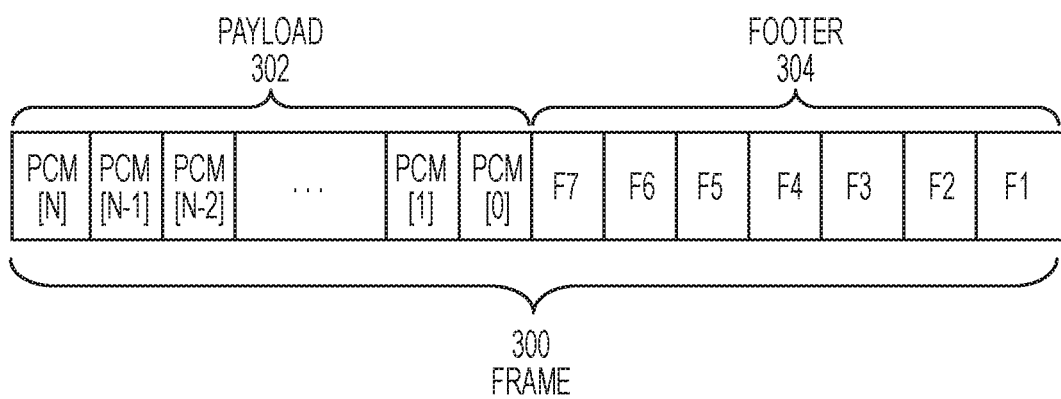
FIG. 3 is an example data structure showing a technique for marking PCM data in an audio data stream according to some embodiments of the disclosure.

FIG. 3 is an example data structure showing a technique for marking PCM data in an audio data stream according to some embodiments of the disclosure. A data frame 300 of footer-marked PCM data may include a PCM payload portion 302 and a footer marker portion 304. The footer portion 302 may be any number of low-order bits, such as the eight lowest order bits as shown in FIG. 3. The PCM payload portion 302 may occupy the remaining bits of the data frame 300. The number of bits in the footer portion 302 may depend on criteria such as size of the data frame 300 and number of bits in the PCM payload portion 302. In one embodiment, the data frame 300 may be 32 bits in size with eight bits used for the footer portion 304 and 24 bits used for the PCM payload portion 302.

Figure 4:
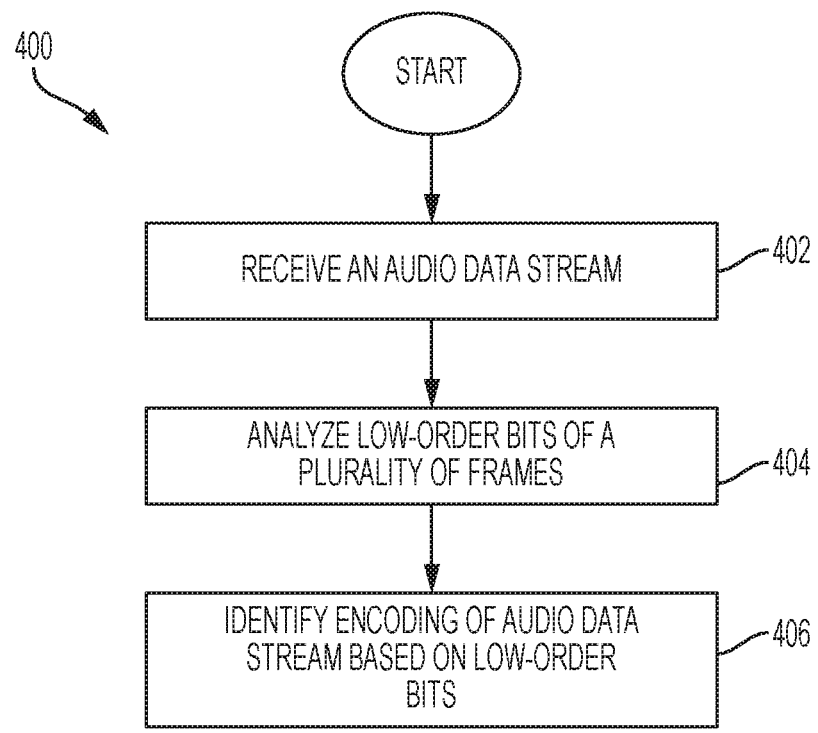
FIG. 4 is a flow chart illustrating an example method for identifying audio data stream encoding by examining footer bits of data frames according to some embodiments of the disclosure.

When a footer-based marker, such as in the data structure of FIG. 3, is used to indicate an encoding type of a data stream, an audio processor may process the data stream as shown in FIG. 4. FIG. 4 is a flow chart illustrating an example method for identifying audio data stream encoding by examining footer bits of data frames according to some embodiments of the disclosure. A method 400 may begin at block 402 with receiving an audio data stream, such as from another circuit component, such as a flash memory, or from a network source, such as an Internet music service. At block 404, low-order bits of a plurality of frames from the audio data stream are analyzed. The number of frames to be analyzed may be a predetermined number, such as 24 frames. The analysis may include, for example, comparing the low-order bits to a predetermined footer value, comparing the low-order bits to a predetermined sequence of footer values, comparing the low-order bits to a predetermined alternating sequence of footer values, and/or comparing the low-order bits to a computed value based on the payload data. At block 406, an encoding of the data stream is identified based on the low-order bits in one or more data frames received at block 402 and analyzed at block 404. When the encoding is identified with a sufficient confidence level, the received audio data stream may be decoded based on the identified encoding and played back or further processed.

The low-order bits analyzed at block 404 may be a footer value attached to a PCM payload as shown in FIG. 3 as the footer portion 302. The footer portion 302 may be a fixed value, an alternating fixed value, a predetermined sequence of values, or a value computed based on the PCM data. Some embodiments of footer portion 302 are shown in FIG. 5, FIG. 6, and FIG. 7.

Figure 5:
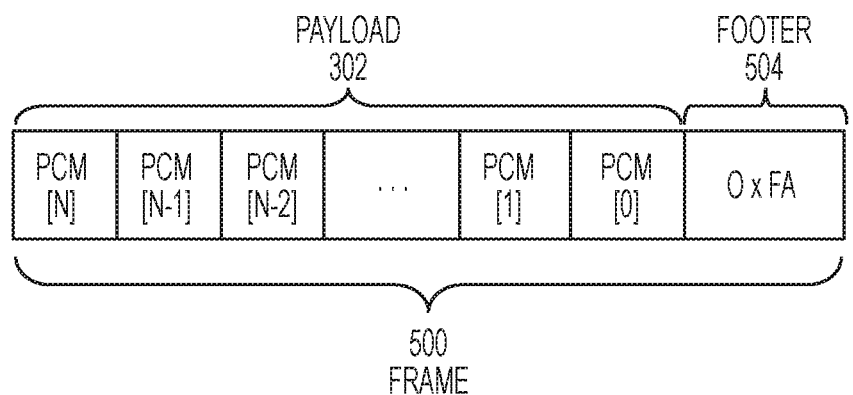
FIG. 5 is an example data structure showing a technique for marking PCM data using a fixed footer according to some embodiments of the disclosure.

FIG. 5 is a data structure showing a technique for marking PCM data using a fixed footer according to some embodiments of the disclosure. In data frame 500, the footer portion 504 is shown as a fixed value, such as hexadecimal value 0xFA or 0x05. Other values may be used as the fixed value. For example, all ones or all zeroes may be used. All zeroes or all ones may be beneficial as being a more unique marker. Such a marker is less likely to occur in an actual DSD audio data stream, and thus is better for marking PCM data. A 0 dB-SACD DSD stream has a modulation index of 50%, which is equivalent to no more than 21 ones in a 28-bit frame. That is, on average, a zero every four bits. Thus, having eight ones or zeros in succession does not happen often or at all in a DSD data stream. An all-zeros or all-ones footer value may also be advantageous because it allows rapid detection of PCM data, because the appearance of eight zeros or eight ones in the LSB positions across two channels and consecutive frames is extremely rare in DSD format. This improves confidence in the PCM detection technique and may allow an audio processor to more quickly determine whether the encoding is PCM or DSD, such as by analyzing a few number of frames at block 404 of FIG. 4. In a similar way, other single-bit formats, such as are used by many DMICs, will have limited maximum modulation indexes which make an all-zeros or all-ones footer a strong indicator that data is not single-bit.

Figure 6:
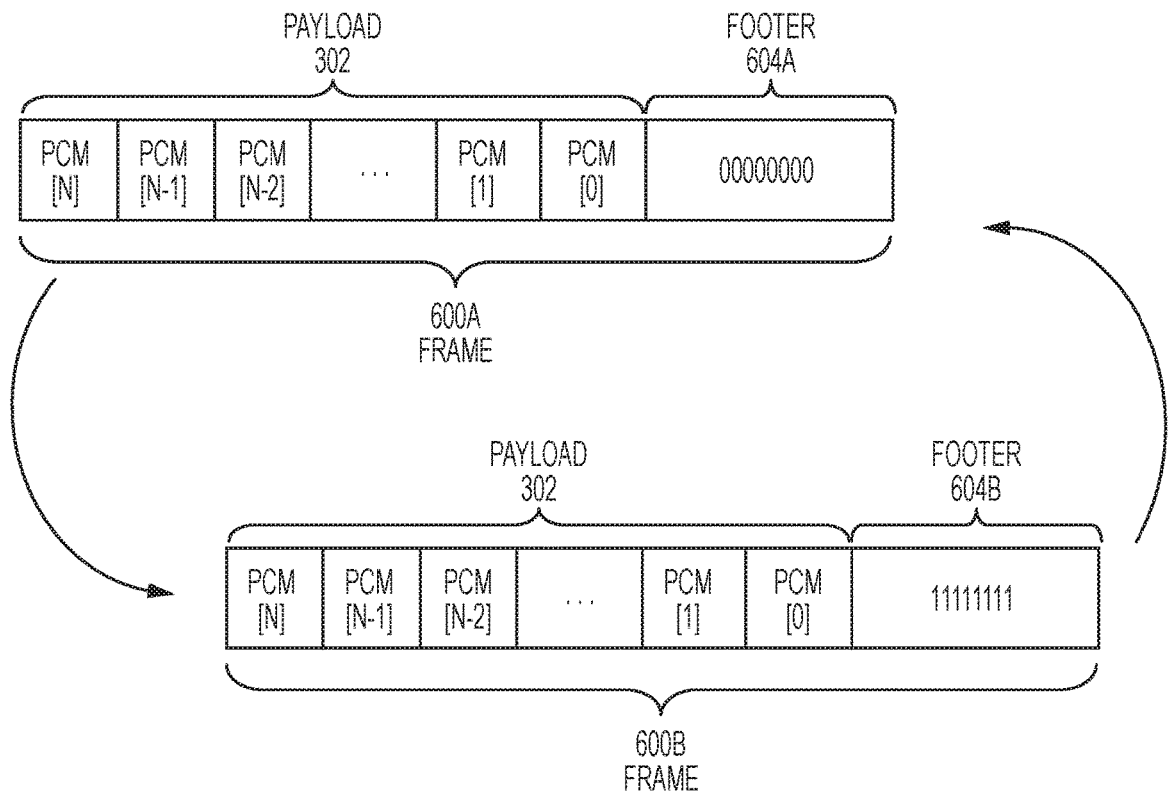
FIG. 6 is an example data structure showing a technique for marking PCM data using a sequence of footers according to some embodiments of the disclosure.

FIG. 6 is a data structure showing another technique for marking PCM data using a sequence of footers according to some embodiments of the disclosure. Data frames 600A and 600B illustrate a sequence of values in footer portion 604A and 604B. The shown sequence is alternating between hexadecimal values 0x00 and 0xFF. In some embodiments, the sequence may include more than two values and/or may include different values. In some embodiments, the footer value may be chosen by an alternate control path to send an expected footer to the receiver.

Figure 7:
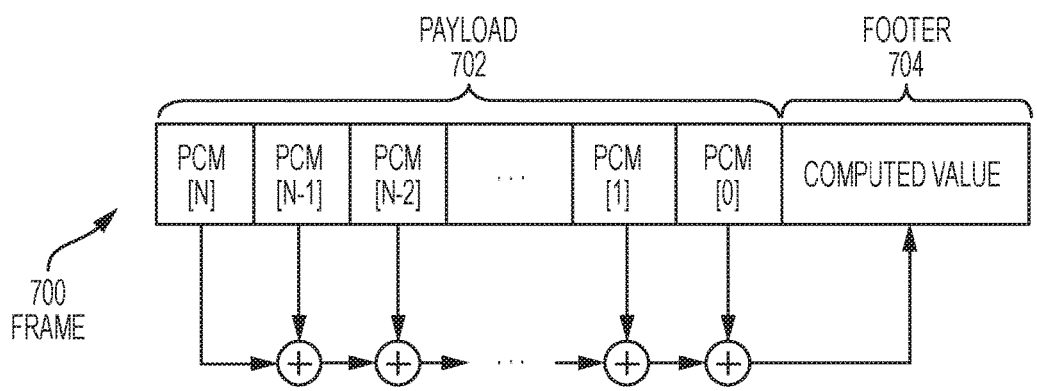
FIG. 7 is an example data structure showing a technique for marking PCM data using a computed value as a footer according to some embodiments of the disclosure.

FIG. 7 is a data structure showing a technique for marking PCM data using a computed value as a footer according to some embodiments of the disclosure. In data frame 700, the footer portion 704 may be computed based on the PCM payload portion 702. One or more bits for the footer portion 704 may be computed according to a computation involving one or more bits of the PCM payload portion 702. For example, one of eight bits for the footer portion 704 may be used as a parity check bit computed based on the PCM payload portion 702. The remainder of the footer portion 704 may include a fixed value or alternating sequence as described with reference to FIG. 5 and FIG. 6. In some embodiments, all of the bits for the footer portion 704 may be based on the PCM payload portion 702. For example, the footer portion 704 may include Hamming codes for error correction. In some embodiments, the PCM payload portion 702 may be 26 bits that are protected from a single-bit error using a Hamming(31,26) code by storing five parity bits used to implement the Hamming(31,26) code in the footer portion 704. An additional parity bit may be added to the Hamming(31,26) code for Single Error Correction, Double Error Detection (SEC-DED). Using techniques associated with a computed footer value, erroneous PCM frames can be detected and possibly corrected. If an uncorrectable error is encountered during decoding of the audio data stream, then the last valid sample from the audio data stream may be reused until a correct PCM frame is received in the audio data stream. A continuous stream of PCM frames with errors can serve as an indicator that the audio data stream has switched to DSD audio data.

Figure 8:
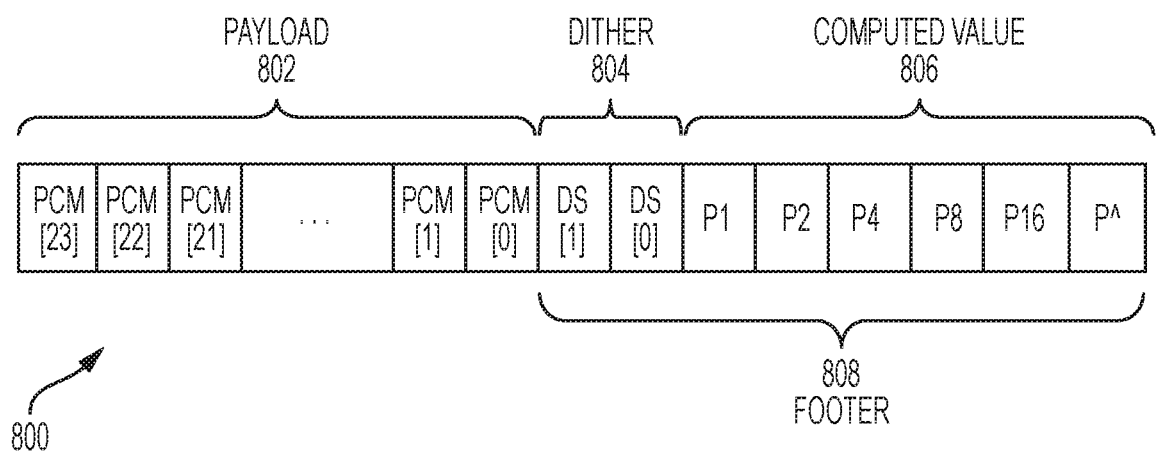
FIG. 8 is an example data structure showing a technique for including dither bits with a computed value as a footer according to some embodiments of the disclosure.

Portions of a footer value for a PCM data frame may be used to adjust the reproduced audio of the PCM audio. FIG. 8 is a data structure showing a technique for including dither bits with a computed value as a footer according to some embodiments of the disclosure. In data frame 800, the footer portion 808 may include a computed value portion 806 and a dither portion 804. The dither portion 804 may be excluded from bits used to compute the computed value portion 806. The computed value portion 806 may be, for example, Hamming code parity bits or other computed values. When the entire data frame 800 is treated as a full PCM word, the dither bits may be used to whiten part of the spectrum and reduce any parity-induced FFT artifacts. For example, with a PCM payload of 24 bits and two dither bits, the frame 800 may be treated as a full 32-bit PCM word with the dither bits whitening the spectrum at the 25-bit level (−152 decibels) to reduce artifacts to the 27-bit level (−164 decibels).

Another example use for the dither portion 804 is as samples of a scrambling shift register generator (SRG). The computed value portion 806, such as Hamming code parity bits, may be scrambled by a SRG and the dither portion 804 filled with samples of the scrambling SRG. The dither portion 804 may be used to train the receiving SRG to be synchronized to the scrambling SRG using, for example, distributed sample scrambling (DSS). Computed parity bits P1, P2, P4, P8, P16, and P^ may be XORed with the scrambling bit stream from the SRG to produce P1', P2', P4', P8', P16', and P^', which are transmitted in the computed value portion 806. On the receiving side, the scrambled parity bits are XORed with the synchronized receiver SRG bit stream, to produce the original parity bits for comparison to a received PCM payload. The activity of the scrambling and descrambling decorrelates the parity bits from the PCM payload, which reduces or eliminates distortion at the receiver when the entire data frame is output as a PCM symbol for reproduction at a transducer.

The footer values for marking PCM data in an audio data stream described above may be used to identify a type of data in the audio data stream. For example, the audio data stream may switch between DSD-encoded data and PCM-encoded data. The footer values may be used by a device receiving the audio data stream to identify when to decode the audio data stream as PCM-encoded data and when to decode the audio data stream as DSD-encoded data. Improving the detection accuracy and switching speed in this manner improves the user experience by reducing unintended noise and/or silence from reproduction through a speaker. One example method for detecting and switching between encodings when receiving an audio data stream is described with reference to FIG. 9.

Figure 9:
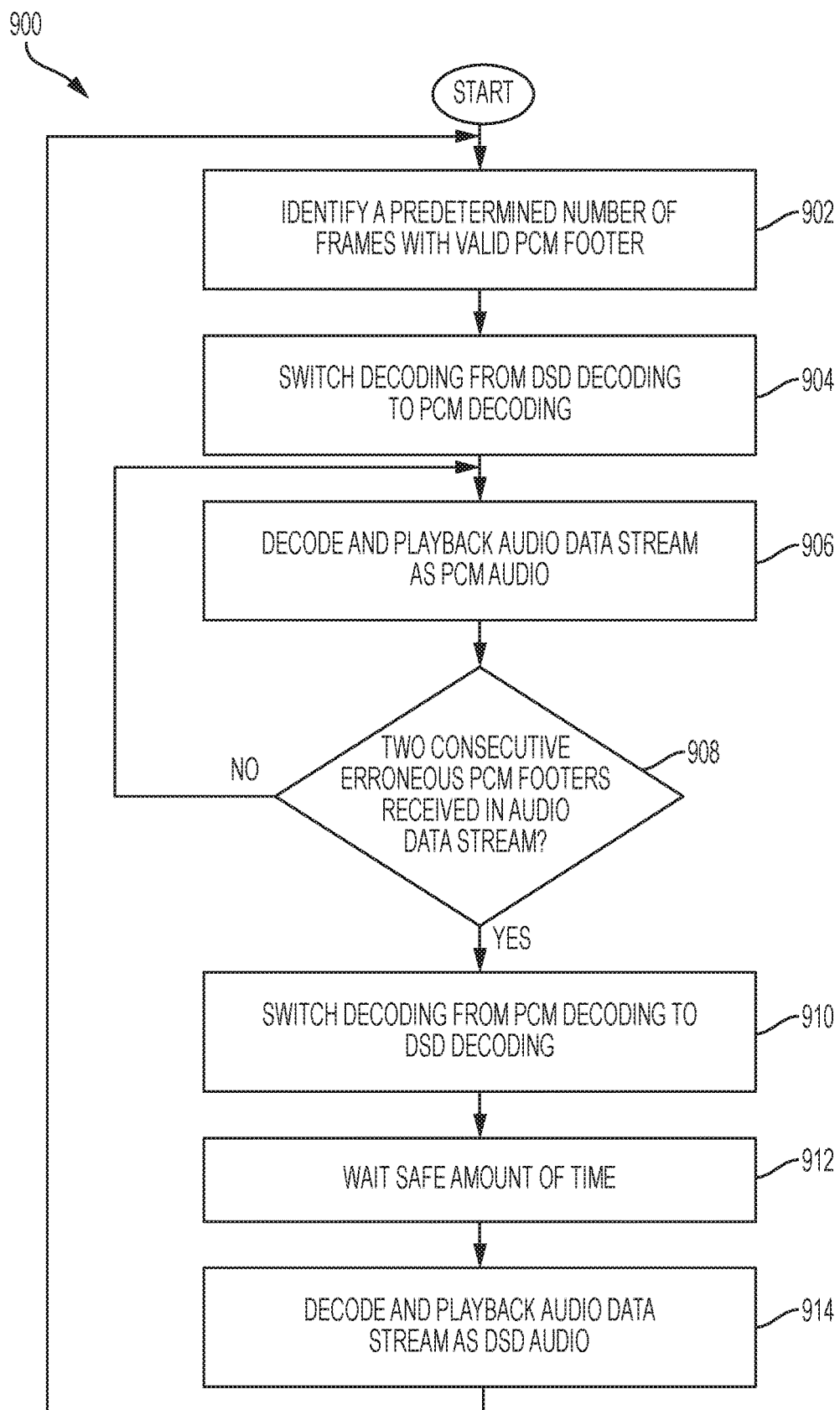
FIG. 9 is a flow chart illustrating an example method for switching between DSD and PCM decoding during playback of an audio data stream according to some embodiments of the disclosure.

FIG. 9 is a flow chart illustrating an example method for switching between DSD and PCM decoding during playback of an audio data stream according to some embodiments of the disclosure. A method 900 may begin at block 902 with identifying a predetermined number of frames in an audio data stream with a valid PCM footer. For example, 32 consecutive valid PCM frames may provide a sufficient confidence level to determine that the audio data stream is PCM-encoded. At block 904, the decoding is switched from DSD to PCM based on the identification at block 902. At block 906, the audio data stream is decoded and played back as PCM audio. Decoding refers to obtaining the audio signals for output to a transducer, and playback refers to processing of those signals, such as amplification and/or equalization, for reproducing the audio signals on the transducer. The PCM playback may continue until a certain error condition is encountered that indicates the audio data stream no longer contains PCM-encoded audio. For example, at block 908, it is determined whether two consecutive erroneous PCM footers are received from the audio data stream. If not, the decoding and playback of PCM audio continues at block 906. When the error condition is detected at block 908, the method 900 switches from PCM decoding to DSD decoding at block 910. At block 912, a safe amount of time may be waited after the switch at block 910 before beginning decoding and playback of the audio data stream as DSD audio at block 914. DSD decoding and playback may continue at block 914 until a predetermined number of frames with a valid PCM footer are detected again at block 902. The method 900, or other methods involving detecting PCM frames in an audio data stream using a footer value, may be executed by an audio processor in a computing device, such as a mobile phone.

Figure 10:
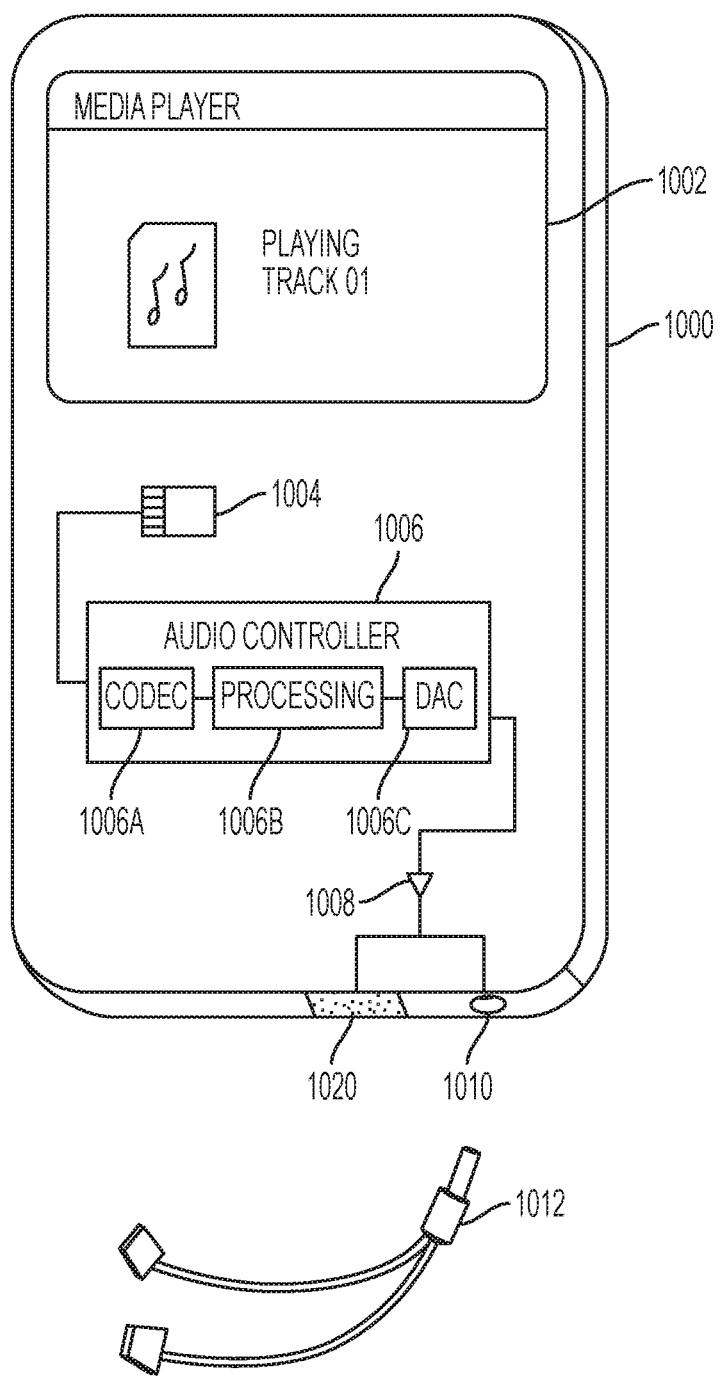
FIG. 10 is an illustration showing an example personal media device for audio playback including an audio controller that is configured to reduce distortion in reproduced audio according to one embodiment of the disclosure.

One advantageous embodiment for an audio processor described herein is a personal media device for playing back music, high-fidelity music, and/or speech from telephone calls. FIG. 10 is an illustration showing an example personal media device for audio playback including an audio controller that is configured to reduce distortion in reproduced audio according to one embodiment of the disclosure. A personal media device 1000 may include a display 1002 for allowing a user to select from music files for playback, which may include both high-fidelity music files and normal music files. When music files are selected by a user, audio files may be retrieved from memory 1004 by an application processor (not shown) and provided to an audio controller 1006. The audio controller 1006 may include a coder/decoder (CODEC) 1006A, audio processing circuitry 1006B, and digital-to-analog converter (DAC) 1006C. The CODEC 1006A may implement audio processing to detect PCM or DSD formats in an audio data stream received from memory 1004, such as according to the embodiments of FIG. 4 and FIG. 9. The digital audio (e.g., music or speech) may be converted to analog signals by the audio controller 1006, and those analog signals amplified by an amplifier 1008. The amplifier 1008 may be coupled to an audio output 1010, such as a headphone jack, for driving a transducer, such as headphones 1012. The amplifier 1008 may also be coupled to an internal speaker 1020 of the device 1000. Although the data received at the audio controller 1006 is described as received from memory 1004, the audio data may also be received from other sources, such as a USB connection, a device connected through Wi-Fi to the personal media device 1000, a cellular radio, an Internet-based server, another wireless radio, and/or another wired connection.

Although decoding of audio using a variety of techniques for marking an encoding type of the audio data with a footer value are described above, a controller may also encode an audio data stream based on these formats. A method of encoding may include receiving an audio signal to encode in an audio data stream, followed by encoding the audio signal into a plurality of data frames for the audio data stream, wherein each of the plurality of data frames comprises a footer value in low-order bits of each of the plurality of data frames indicating an encoding of the audio data stream. The footer value may be used to mark data frames as containing single-bit data (e.g., DSD data) or multi-bit data (e.g., PCM data). The encoding may place values in the footer using a predetermined footer value, a sequence of predetermined footer values, alternating footer values, and/or a computed footer value based on the payload data. The encoding method may be performed on a personal media device such as described with reference to FIG. 10. The encoding may also be performed on a server, such as at a remote location or in a cloud computing system. For example, the audio data from a concert or stored music library may be encoded and transmitted to the personal media device through a network connection The operations described above as performed by a controller may be performed by any circuit configured to perform the described operations. Such a circuit may be an integrated circuit (IC) constructed on a semiconductor substrate and include logic circuitry, such as transistors configured as logic gates, and memory circuitry, such as transistors and capacitors configured as dynamic random access memory (DRAM), electronically programmable read-only memory (EPROM), or other memory devices. The logic circuitry may be configured through hard-wire connections or through programming by instructions contained in firmware. Further, the logic circuitry may be configured as a general-purpose processor (e.g., CPU or DSP) capable of executing instructions contained in software. The firmware and/or software may include instructions that cause the processing of signals described herein to be performed. The circuitry or software may be organized as blocks that are configured to perform specific functions. Alternatively, some circuitry or software may be organized as shared blocks that can perform several of the described operations. In some embodiments, the integrated circuit (IC) that is the controller may include other functionality. For example, the controller IC may include an audio coder/decoder (CODEC) along with circuitry for performing the functions described herein. Such an IC is one example of an audio controller. Other audio functionality may be additionally or alternatively integrated with the IC circuitry described herein to form an audio controller.

If implemented in firmware and/or software, functions described above may be stored as one or more instructions or code on a computer-readable medium. Examples include non-transitory computer-readable media encoded with a data structure and computer-readable media encoded with a computer program. Computer-readable media includes physical computer storage media. A storage medium may be any available medium that can be accessed by a computer. By way of example, and not limitation, such computer-readable media can comprise random access memory (RAM), read-only memory (ROM), electrically-erasable programmable read-only memory (EEPROM), compact disc read-only memory (CD-ROM) or other optical disk storage, magnetic disk storage or other magnetic storage devices, or any other medium that can be used to store desired program code in the form of instructions or data structures and that can be accessed by a computer. Disk and disc includes compact discs (CD), laser discs, optical discs, digital versatile discs (DVD), floppy disks and Blu-ray discs. Generally, disks reproduce data magnetically, and discs reproduce data optically. Combinations of the above should also be included within the scope of computer-readable media.

In addition to storage on computer readable medium, instructions and/or data may be provided as signals on transmission media included in a communication apparatus. For example, a communication apparatus may include a transceiver having signals indicative of instructions and data. The instructions and data are configured to cause one or more processors to implement the functions outlined in the claims.

The described methods are generally set forth in a logical flow of steps. As such, the described order and labeled steps of representative figures are indicative of aspects of the disclosed method. Other steps and methods may be conceived that are equivalent in function, logic, or effect to one or more steps, or portions thereof, of the illustrated method. Additionally, the format and symbols employed are provided to explain the logical steps of the method and are understood not to limit the scope of the method. Although various arrow types and line types may be employed in the flow chart diagram, they are understood not to limit the scope of the corresponding method. Indeed, some arrows or other connectors may be used to indicate only the logical flow of the method. For instance, an arrow may indicate a waiting or monitoring period of unspecified duration between enumerated steps of the depicted method. Additionally, the order in which a particular method occurs may or may not strictly adhere to the order of the corresponding steps shown.

Although the present disclosure and certain representative advantages have been described in detail, it should be understood that various changes, substitutions and alterations can be made herein without departing from the spirit and scope of the disclosure as defined by the appended claims. Moreover, the scope of the present application is not intended to be limited to the particular embodiments of the process, machine, manufacture, composition of matter, means, methods and steps described in the specification. For example, where general purpose processors are described as implementing certain processing steps, the general purpose processor may be a digital signal processors (DSPs), a graphics processing units (GPUs), a central processing units (CPUs), or other configurable logic circuitry. As one of ordinary skill in the art will readily appreciate from the present disclosure, processes, machines, manufacture, compositions of matter, means, methods, or steps, presently existing or later to be developed that perform substantially the same function or achieve substantially the same result as the corresponding embodiments described herein may be utilized. Accordingly, the appended claims are intended to include within their scope such processes, machines, manufacture, compositions of matter, means, methods, or steps.

What is claimed is:

1. A method, comprising:
   receiving an audio data stream;
   analyzing a selected set of low-order bits of a plurality of frames from the audio data stream to determine whether a footer is present indicating the audio data stream is a first format;
   decoding the received audio data stream according to the first format when the footer is present, wherein the decoding comprises decoding high-order bits of a frame of the plurality of frames that also comprises the footer based on the presence of the footer in the frame; and
   decoding the received audio data stream according to a second format when the footer is not present.

2. The method of claim 1, wherein the first format comprises multi-bit data and the second format comprises single-bit data.

3. The method of claim 1, wherein the second format comprises direct stream digital (DSD) data and the first format comprises pulse code modulation (PCM) data.

4. The method of claim 1, wherein the step of analyzing comprises: comparing the selected set of low-order bits to a predetermined footer value.

5. The method of claim 1, wherein the step of analyzing comprises: comparing the selected set of low-order bits to a predetermined sequence of footer values.

6. The method of claim 5, wherein the step of analyzing comprises: comparing the selected set of low-order bits to a predetermined sequence of alternating footer values.

7. The method of claim 1, wherein the step of analyzing comprises: comparing the selected set of low-order bits for one of the plurality of frames to a footer value computed based on a payload of the one of the plurality of frames.

8. The method of claim 7, wherein the step of comparing comprises comparing the selected set of low-order bits to a computed footer value comprising an error code computed from one or more of the plurality of frames.

9. The method of claim 8, further comprising correcting one or more of the plurality of frames of the received audio data stream based, at least in part, on the error code of the computed footer value, wherein the error code of the computed footer value comprises an error correction code.

10. The method of claim 8, wherein the error code of the computed footer value comprises a scrambled error code such that a reproduced audio has low distortion if one of the plurality of frames is reproduced as PCM audio data.

11. An apparatus, comprising:
    an audio controller configured to perform steps comprising:
       receiving an audio data stream;
       analyzing a selected set of low-order bits of a plurality of frames from the audio data stream to determine whether a footer is present indicating the audio data stream is a first format;
       decoding the received audio data stream according to the first format when the footer is present, wherein the decoding comprises decoding high-order bits of a frame of the plurality of frames that also comprises the footer based on the presence of the footer in the frame; and
       decoding the received audio data stream according to a second format when the footer is not present.

12. The apparatus of claim 11, wherein the second data comprises single-bit data and the first data comprises multi-bit data.

13. The apparatus of claim 11, wherein the second data comprises direct stream digital (DSD) data and the first data comprises pulse code modulation (PCM) data.

14. The apparatus of claim 11, wherein the step of analyzing comprises: comparing the selected set of low-order bits to a predetermined footer value.

15. The apparatus of claim 11, wherein the step of analyzing comprises: comparing the selected set of low-order bits to a predetermined sequence of footer values.

16. The apparatus of claim 15, wherein the step of analyzing comprises: comparing the selected set of low-order bits to a predetermined sequence of alternating footer values.

17. The apparatus of claim 11, wherein the step of analyzing comprises: comparing the selected set of low-order bits for one of the plurality of frames to a footer value computed based on a payload of the one of the plurality of frames.

18. The apparatus of claim 17, wherein the step of comparing comprises comparing the selected set of low-order bits to a computed footer value comprising an error code computed from one or more of the plurality of frames.

19. The apparatus of claim 18, wherein the controller is further configured to perform steps comprising correcting one or more of the plurality of frames of the received audio data stream based, at least in part, on the error code of the computed footer value, wherein the error code of the computed footer value comprises an error correction code.

20. The apparatus of claim 18, wherein the error code of the computed footer value comprises a scrambled error code such that a reproduced audio has low distortion if one of the plurality of frames is reproduced as PCM audio data.

* * * * *